United States Patent [19]
Nadeau-Dostie et al.

[11] Patent Number: 6,145,105
[45] Date of Patent: Nov. 7, 2000

[54] METHOD AND APPARATUS FOR SCAN TESTING DIGITAL CIRCUITS

[75] Inventors: Benoit Nadeau-Dostie; Jean-François Côté, both of Aylmer; Dwayne Burek, Nepean, all of Canada

[73] Assignee: LogicVision, Inc., San Jose, Calif.

[21] Appl. No.: 09/192,839

[22] Filed: Nov. 16, 1998

Related U.S. Application Data

[63] Continuation of application No. 08/752,499, Nov. 20, 1996.

[51] Int. Cl.[7] .................................................. G01R 31/28
[52] U.S. Cl. ........................................................ 714/726
[58] Field of Search ............................ 714/726, 727, 714/728, 733, 736, 30; 324/765

[56] References Cited

U.S. PATENT DOCUMENTS

| | | | |
|---|---|---|---|
| 4,503,537 | 3/1985 | McAnney | 714/728 |
| 5,329,533 | 7/1994 | Lin | 714/727 |
| 5,349,587 | 9/1994 | Nadeau-Dostie et al. | 714/727 |
| 5,459,736 | 10/1995 | Nakamura | 714/727 |
| 5,519,714 | 5/1996 | Nakamura et al. | 714/727 |
| 5,533,032 | 7/1996 | Johnson | 714/733 |
| 5,614,838 | 3/1997 | Jaber et al. | 324/765 |
| 5,627,841 | 5/1997 | Nakamura | 714/731 |

OTHER PUBLICATIONS

Kee Sup Kim and Len Schultz, "Multi–Frequency, Multi–Phase Scan Chain," IEEE International Test Conference 1994, Paper 11.1, pp. 323–330.

*Primary Examiner*—Albert De Cady
*Assistant Examiner*—Jason Greene
*Attorney, Agent, or Firm*—Skjerven, Morrill, MacPherson, Franklin & Friel LLP; Norman R. Klivans

[57] ABSTRACT

A method and digital system for testing scannable memory and combinational networks. The scannable memory is configurable into several scan chains. Each chain may have a different effective clock rate, as determined by respective clock enable signals. The method and digital system allow scan testing of digital circuits that use a single operational clock rate and several functional clock enable signals to effect slower lock operating rates. The digital system includes memory elements having scan enable and clock enable inputs.

28 Claims, 9 Drawing Sheets

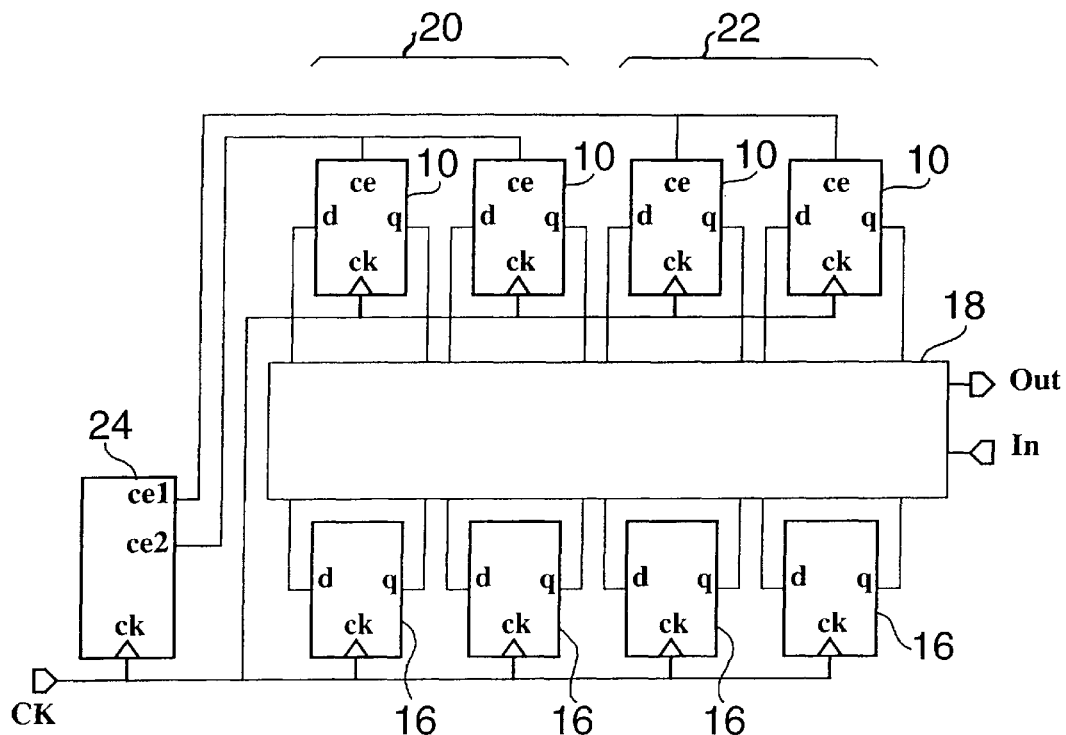
FIG. 1c
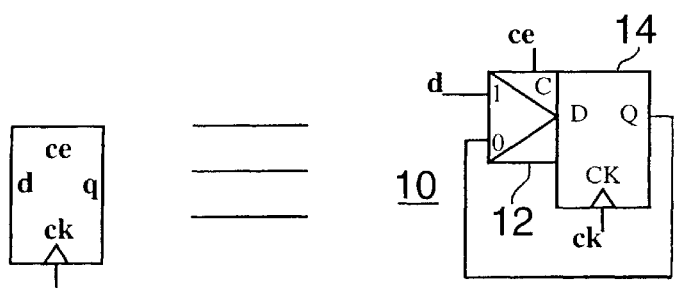
FIG.1b  FIG. 1a

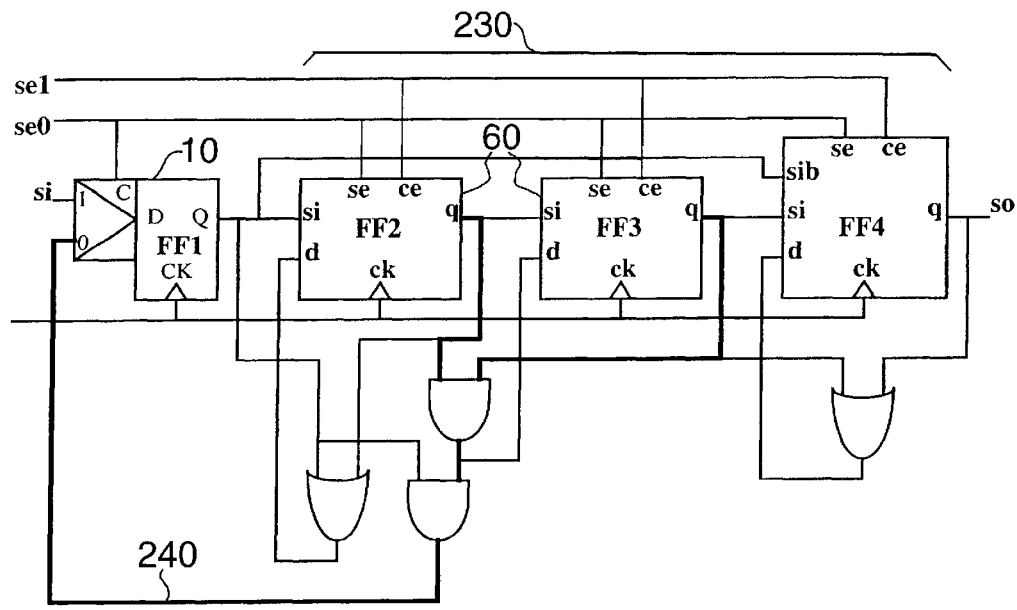
FIG. 7c
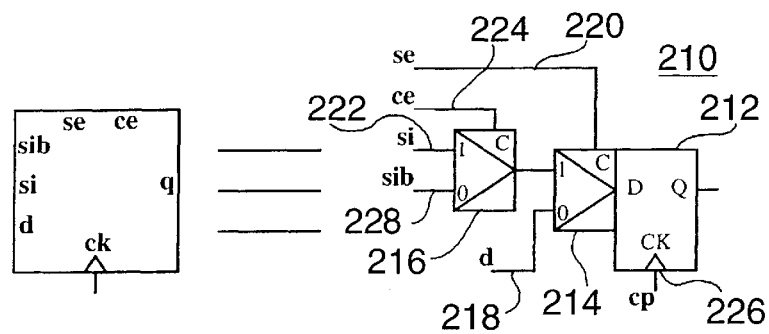
FIG. 7b　　　FIG. 7a

METHOD AND APPARATUS FOR SCAN TESTING DIGITAL CIRCUITS

This application is a continuation application of Ser. No. 08/752,499, filed Nov. 20, 1996.

FIELD OF THE INVENTION

This invention relates to methods and apparatus for testing digital systems such as digital integrated circuits and more particularly to methods and apparatus for testing such systems using scan testing techniques.

BACKGROUND TO THE INVENTION

Conventional digital integrated circuits comprise complex combinational networks for performing logical operations on data and memory elements interconnected with the combinational networks to provide memory functions essential to the operation of the combinational networks. Such integrated circuits are difficult to test due to the complexity of their operation.

Modern digital integrated circuit designers incorporate test features in digital integrated circuits at the design stage to ensure that such circuits are testable. In one design technique known as Level Sensitive Scan Design (LSSD) designers partition circuits into combinational networks and scannable memory elements usually flip flops. The flip flops are made reconfigurable from their operating configuration in which they are connected to the combinational networks of the circuits as required to support normal operation of the circuit to a scan configuration in which they are decoupled from the combinational networks and connected in series to form one or more shift registers known as scan chains.

The scan configuration is used during testing of the circuit to shift a known test stimulus pattern into the scan chains. The flip flops are then put into the operation configuration for at least one clock cycle so that the combinational networks performing logical operations on some of the data making up the test stimulus pattern and alter the data stored in some of the flip flops. The flip flops are then returned to the scan configuration to shift the altered data out of the scan chains as a test response pattern. The test response pattern is compared with a calculated test response pattern or with a test response pattern obtained from a circuit which is known to be functioning properly to determine whether the circuit under test if functioning properly.

Previously proposed scan testing techniques for circuits operating at multiple clock speeds used a single slowless speed clock as in U.S. Pat. No. 4,503,537 or multiple clocks for the scannable elements grouped for clocking by appropriate clocks as taught in U.S. Pat. No. 5,349,587. Both of these known techniques were applied to circuits having multiple clocks for normal operation.

Recently, digital circuit designs have been developed that eliminate the use of multiple clocks. This has been done to obviate timing problems associated with timing edges for multiple clocks being out of synchronization on arrival at the clock input of memory elements. In place of multiple clocks, these new digital circuit designs using a single master clock signal at a highest desired operating frequency. Lower clock rate sections of the digital circuit are implemented using specially designed flip flops that have clock enable signals derived from multiple clocks but synchronized with the master clock signal.

While this design technique solves the operational problems faced by the circuit designers, it creates new problems for circuit testing. The technique of U.S. Pat. No. 4,503,537 could be used with the same short comings of not testing at all frequencies used in operation. The technique of U.S. Pat. No. 5,349,587 could be used for scan testing but may introduce into the testing environment those same problems that circuit designers were trying to eliminate in the operation environment by not using multiple clocks.

Clearly, there is a need in the prior art for a scan testing technique for the digital circuit design described above.

SUMMARY OF THE INVENTION

The present invention seeks to provide an improved memory scanning method for testing digital circuits and a digital circuit for use therewith.

According to one aspect of the present invention, there is provided a memory scanning method for use in testing digital systems having a plurality of scannable memory elements and a logic network, each memory element having an output and a data input, and being configurable in a SCAN mode in which the data input of each the element is connected to the output of another of the elements so as to define a scan chain for serially shifting data into and out of the elements, and in a CAPTURE mode in which the input is connected to the logic network, at least one of said elements being configurable in a HOLD mode for holding data therein during one or more clock cycles of a test clock, the logic network defining signal paths therethrough for each elements, the paths extending from the output of the memory elements to a data input, at least one of the elements having a signal path duration which is greater than one period of a test clock rate, the method comprising:

configuring the elements in a SCAN mode;

shifting a test stimulus pattern into the scan chain and into the elements thereof until the test stimulus pattern is shifted into all scannable memory elements;

during the shifting, configuring in the HOLD mode, for a predetermined number of clock cycles prior to a CAPTURE operation, each element having a signal path whose duration is greater than one test clock cycle, the predetermined number of clock cycles being equal to the number of cycles required for a signal output from the each element to propagate to the input of the another memory element;

configuring the scannable memory elements in a CAPTURE mode to capture the signal at the inputs of the elements, the signal being representative of the response of the logic network to the test stimulus pattern;

configuring the elements in a SCAN mode;

and shifting out the data from the elements.

The present invention also provides a digital circuit specifically adapted to operating according to this method.

Another embodiment of the present invention provides a memory scanning method for use in testing digital systems having a plurality of scannable memory elements and a logic network, each the memory element having an output and a data input, and being configurable in a SCAN mode in which the data input of each the element is connected to the output of another of the elements so as to define a scan chain for serially shifting data into and out of the elements; and in a CAPTURE mode in which the input is connected to the logic network, at least one of the elements being configurable in a HOLD mode for holding data therein during one or more clock cycles of a test clock the elements being arranged in at least one scan chain, the method comprising:

configuring the elements in all scan chains in a SCAN mode;

shifting a test stimulus pattern into each the scan chain and into each the elements therein until the test stimulus pattern is shifted into all scannable memory elements;

during the shifting, configuring each element in each of the scan chains in the HOLD mode for a predetermined number of clock cycles between SHIFT cycles or between a SHIFT cycle and a CAPTURE cycle;

configuring the scannable memory elements in all scan chains in a CAPTURE mode to capture the signal at the inputs of the elements, the signal being representative of the response of the logic network to the test stimulus pattern;

configuring the elements in a SCAN mode;

and shifting out the data from the elements.

The present invention also provides a digital circuit specifically adapted for operating according to this method.

BRIEF DESCRIPTION OF THE DRAWINGS

The invention will be further understood from the following description with reference to the drawings in which:

FIGS. 1a) b) and c) illustrate in a block diagram and symbol a known memory element and a known digital system;

FIGS. 7a, 7b and 7c illustrates in block diagrams a fourth memory element configuration and its application in a circuit in accordance with an embodiment of the present invention;

DETAILED DESCRIPTION

Figure 2C:
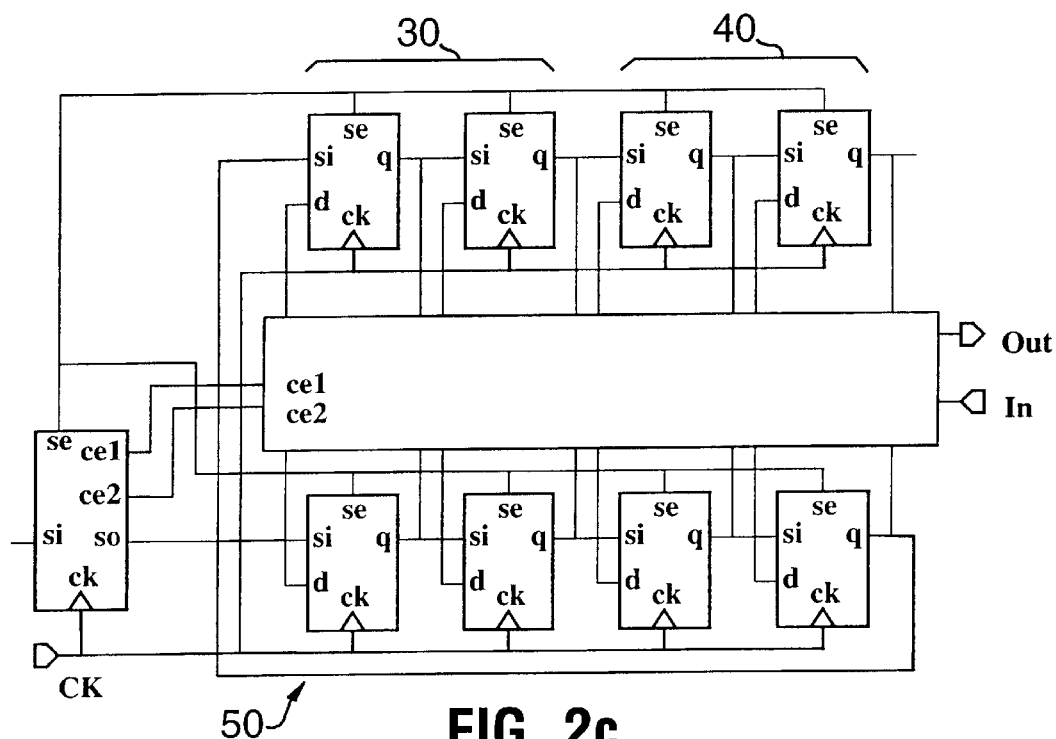
FIGS. 2a), b) and c) illustrates in a block diagram a known scannable element and a digital system connected to a combinational network to make a scan testable system.
Figure 2B:
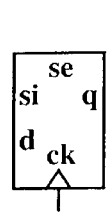

Referring to FIGS. 1a and b, there is illustrated a known memory element 10. The memory element 10 comprises a data multiplexer 12 and an edge triggered flip flop 14 in response to a clock enable ce. The multiplexer 12 selects either a data input d or an input for application of the output Q of the flip-flop 14 thereto. The flip-flop 14 transfers the signal at its data input d in parallel to the Q output when triggered by a clock signal CK and a clock enable signal ce.

Referring to FIG. 1c there is illustrated a block schematic diagram a plurality of memory elements 10 and 16 connected to a combinational network 18. The memory elements 10 and 16 are configurable in a capture operating mode, as shown in FIG. 2a, using data input d at each memory element 10 and 16. In this capture operation mode, the memory elements 10 and 16 are interconnected by the combinational network 18 and provide memory functions which are essential to the operation of the combinational network 18.

The memory elements 10 are in two groups 20 and 22. In normal operation, all memory elements 10 and 16 are clocked by system clock ck. Clock enable signal generator 24 derives clock enable signals ce1 and ce2 from the system clock signal ck, hence clock enable signals ce1 and ce2 are synchronous with ck. Groups 20 and 22 are separately enabled by clock enable signals ce1 and ce2, thereby providing two effective clock rates slower than the system clock ck, while avoiding problems associated with multiple frequency clock signals.

Referring to FIGS. 2a and b, there is illustrated a block diagram and symbol for the memory elements 10 and 16 as configured for scan mode operation. In the configuration, the multiplexer 12 has inputs for data d and scan in si. The multiplexer 12 has an enable input for scan enable se.

Figure 2A:
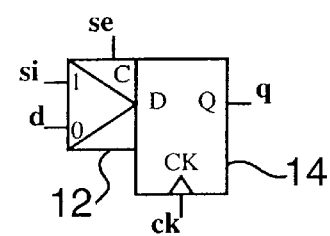

Referring to FIG. 2c, there is illustrated a block diagram schematic of the plurality of scannable memory elements 10 and 16 configured in a scan mode. The memory elements 10 and 16 are configurable in a scan mode as shown in FIG. 2c, by applying a scan enable signal se which causes selection of the scan input si at each memory element 10 and 16. In this mode, the scan mode, the data inputs d of the flip flops 14 of the memory elements 10 are decoupled from the combinational network 20 by the data multiplexer 12 and scan inputs si coupled to the scan outputs so=q of other memory elements 10 to define three scan chains 30, 40 and 50. The scan chains 30, 40 and 50 operate as shift registers into and out of which data patterns can be clocked. Due to timing delays within the circuit, it is necessary to use a lowest common clock rate for CK for the scan testing. As a consequence, memory elements of scan chain 50 cannot be tested at their normal system clock rate.

Figure 3A:
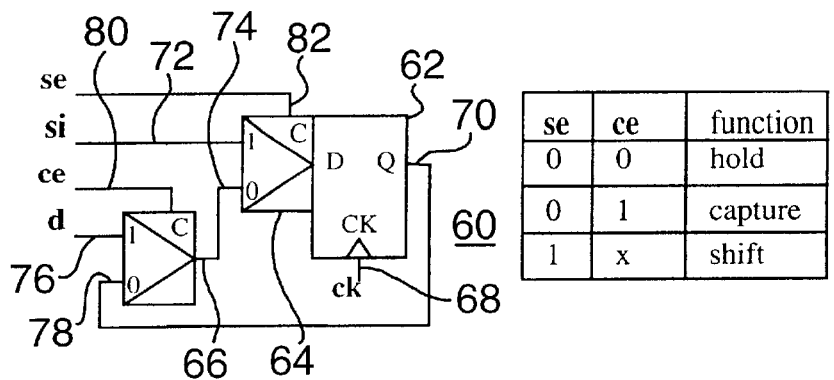
FIGS. 3a, 3b, 3c and 3d illustrate in a block diagram scannable memory elements with an added scan enabling input in accordance with an embodiment of the present invention.

Referring to FIGS. 3a, 3b, 3c and 3d, there are illustrated in schematic block diagrams examples of memory elements being used in recent digital circuit designs with an added scan enabling input in accordance with an embodiment of the present invention. FIG. 3a illustrates a memory element 60 having a data flip flop 62, a multiplexer connected to the data input of flip flop 62 and a second multiplexer 66 coupled to the first multiplexer 64. The data flip flop 62 has a clock input 68 and an output 70. The first multiplexer 64 has inputs 72 and 74 and a select input 82. The second multiplexer has inputs 76, 78 and a select input 80. Input 72 of the first multiplexer 64 provides the scan input and the enabling input 82 the scan enabling input. The second multiplexer 66 uses the first input 76 for data and the second input 78 for q. The enable input 80 is for clock enable.

Figure 3B:
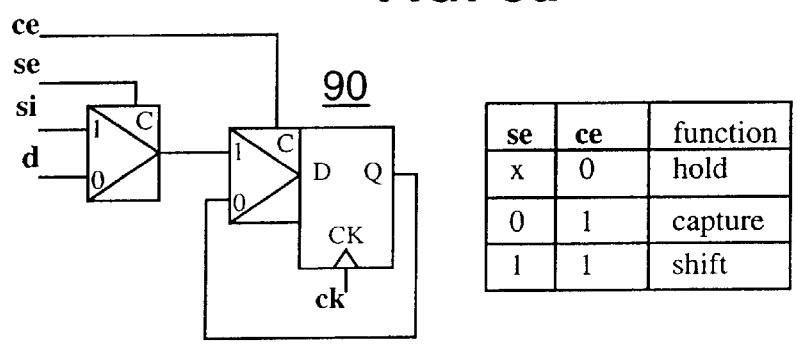
Figure 3C:
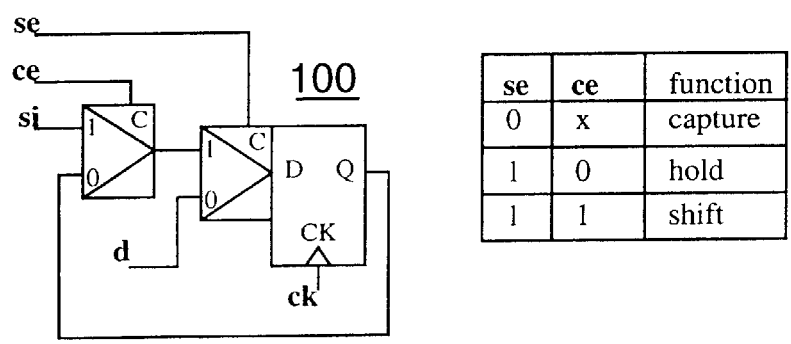
Figure 3D:
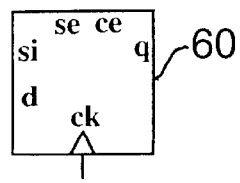

FIGS. 3b and 3c illustrate the same components connected differently to provide priority hold configuration 90 and priority data configuration 100, respectively.

Figure 4:
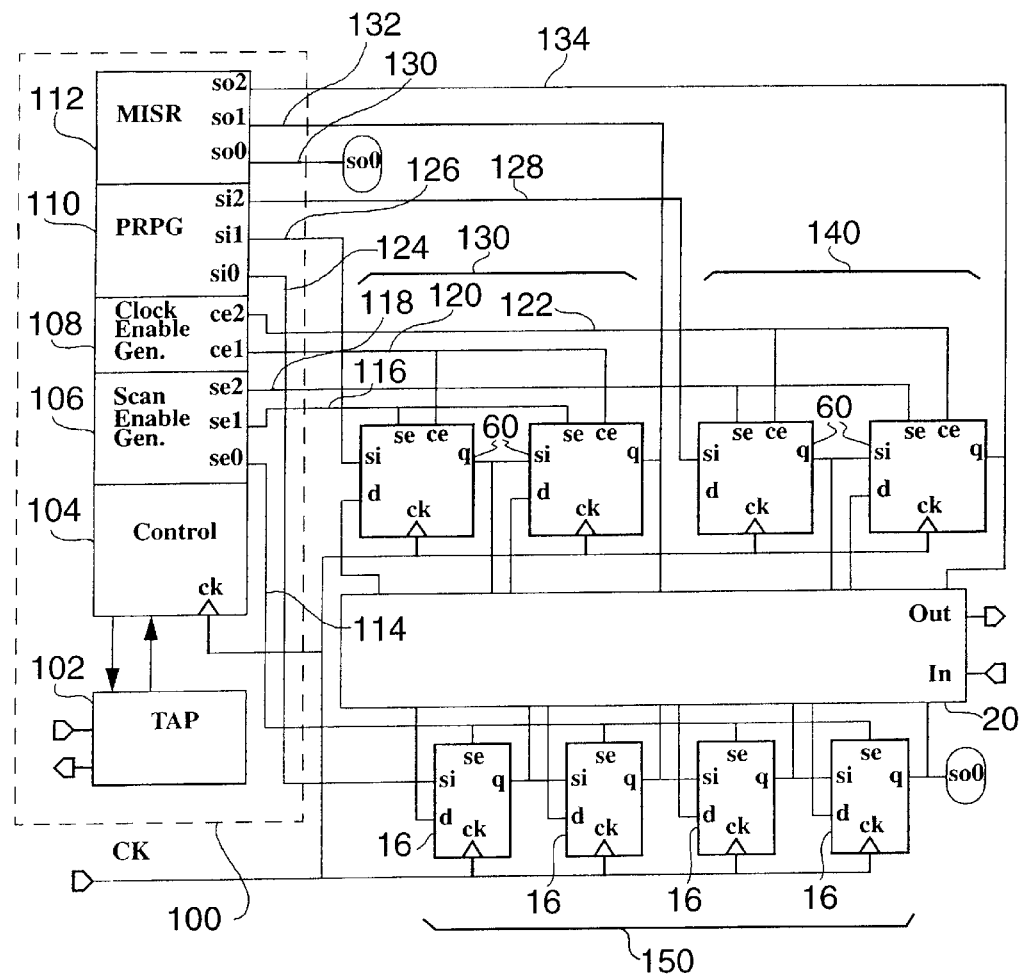
FIG. 4 illustrates in a block diagram scannable memory elements shown in FIG. 3a connected to a combinational network to make a scan testable system in accordance with an embodiment of the present invention.

Referring to FIG. 4, there is illustrated in a block diagram a digital system including memory elements as shown in FIG. 3a in accordance with an embodiment of the present invention. A plurality of scannable memory elements 16 and 60 are connected to a combinational network 20 so as to permit scan testing of the combinational network 20. The memory elements 16 and 60 are configurable in a scan operational mode by applying a scan mode enable signal SEx, (that is se0, se1, se2) and by controlling ce. The digital system of FIG. 2c, also includes a built-in self test BIST controller 100. The BIST controller 100 includes a Test Access Port TAP 102, a control 104, a scan enable signal generator 106, a clock enable signal generator 108, a pseudo random pattern generator (PRPG) 110, and a multiple input signature register (MISR) 112. The scan enable signal generator 106 has outputs 114, 116 and 118 for scan enable signals se0, se1 and se2, respectively.

The clock enable signal generator 108 has clock enable outputs 120 and 122 for clock enable signals ce1 and ce2, respectively. The PRPG 110 has output 124, 126 and 128 for test stimulus patterns si0, si1 and si2, respectively. The MISR 112 has inputs 130, 132, and 134 for test response patterns so0, so1, so2, respectively.

In the normal operational mode, the memory elements 16 and 60 are interconnected by the combinational network 20 and provide memory functions which are essential to the operation of the combinational network 20. The memory elements 16 and 60 are also configurable in a scan mode by applying scan enable signals SEx, and by controlling ce which cause selection of the scan input SI at each memory element 16 and 60.

In operation in the scan mode, the data inputs d of the memory elements 16 and 60 are decoupled from the combinational network 20 and coupled to the scan outputs of preceding memory elements in a scan chain 130, 140, 150 or the PRPG 110. Memory elements 60 define scan chains 130 and 140 while memory elements 16 define scan chain 150. The scan chains 130, 140 and 150 operate as shift registers into and out of which data patterns can be clocked.

The scannable elements 16 and 60 are configured in scan mode by application of a respective scan enable signals se0, se1 and se2 and a predetermined test stimulus pattern is clocked into each scan chain 130, 140 and 150 using a common test clock rate CK and respective clock enable signals CEX. The clock enable signals used during the scan testing provide for testing of the circuit under similar conditions to those found during operation. The actual enable signals used may be the same as the functional enable signals used in normal operation or they may be generated internally or externally for the test mode.

Figure 5A:
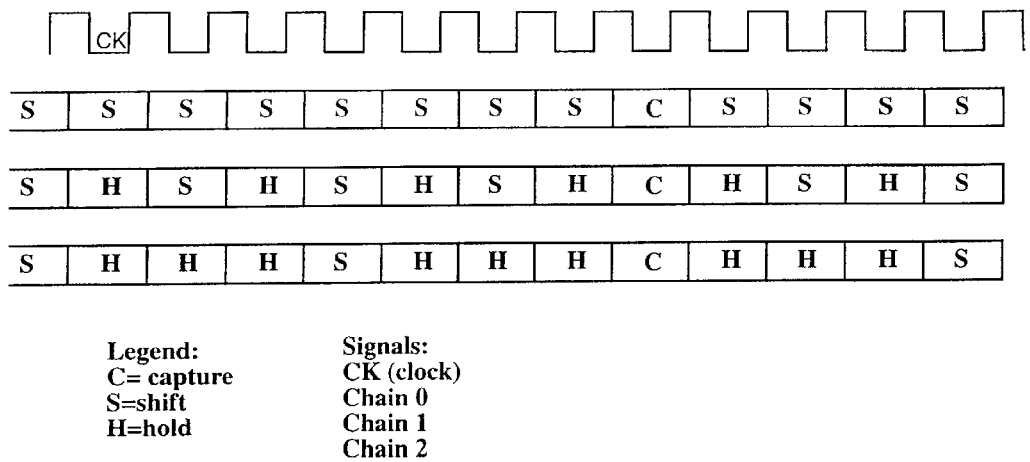
FIGS. 5a, b, c, and d graphically illustrate timing diagrams showing signals used in the testing of the digital system of FIG. 4.
Figure 5B:
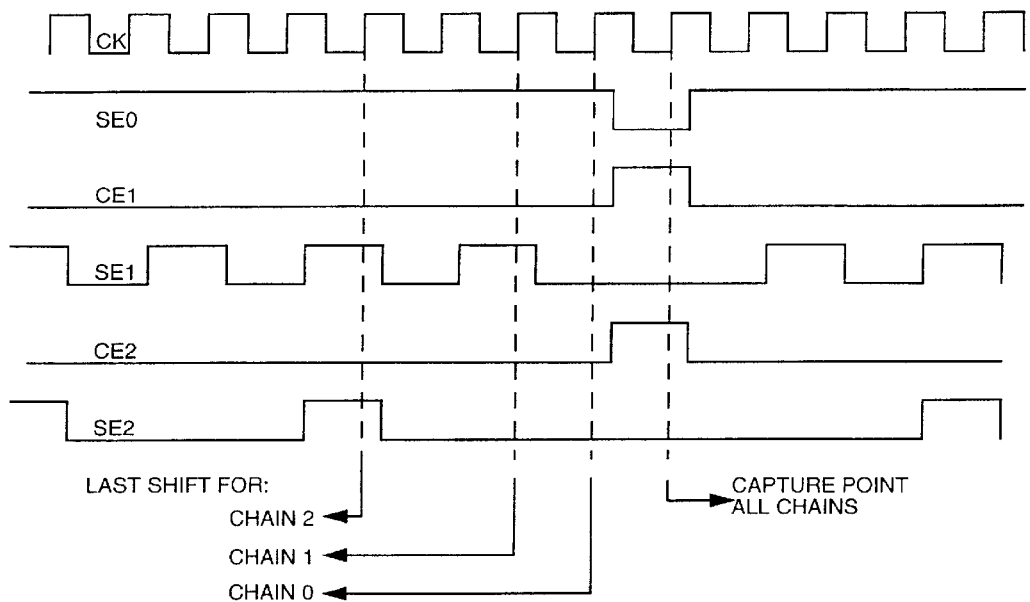
Figure 5C:
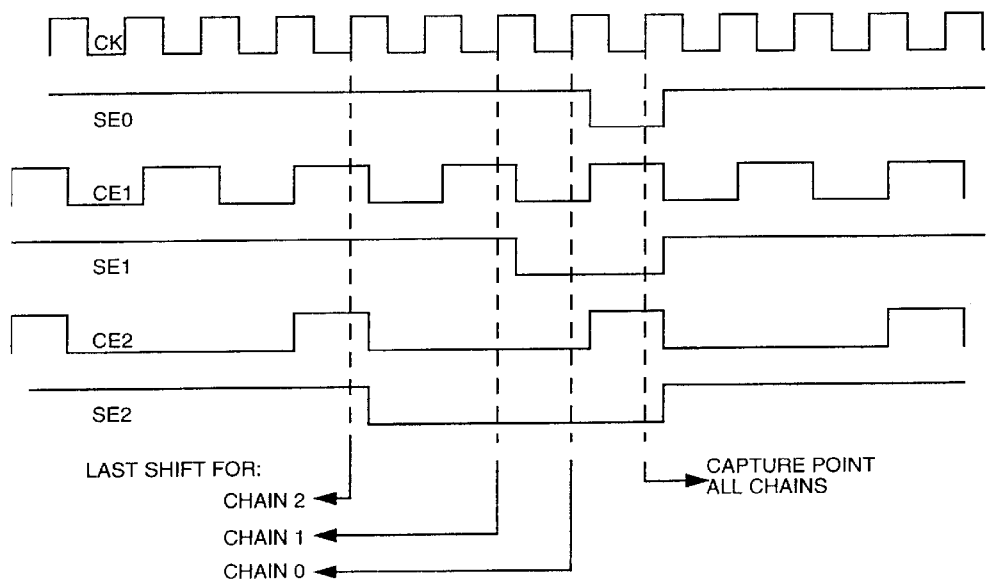
Figure 5D:
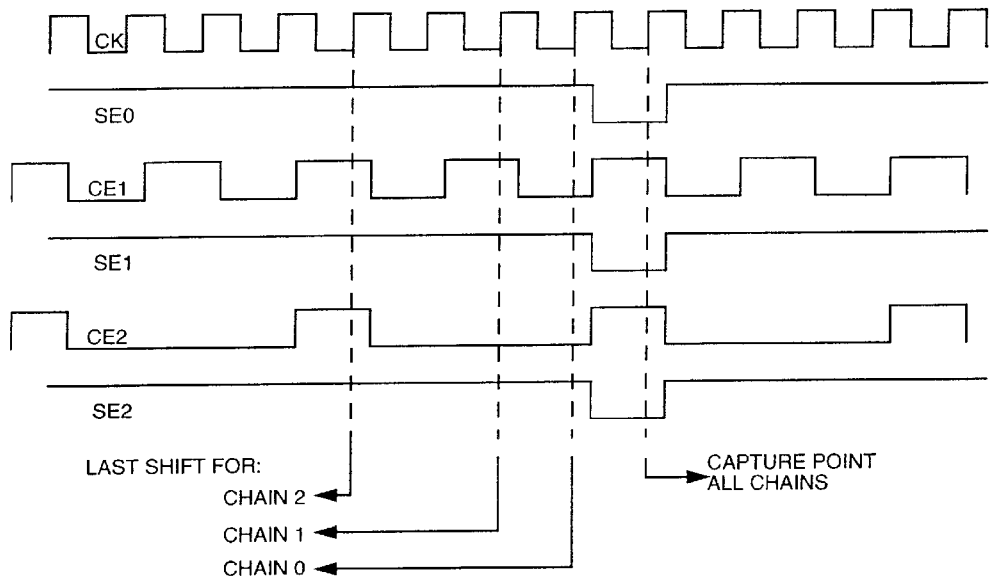

Referring to FIGS. 5a, b, c and d, there are graphically illustrated timing diagrams showing the signals used in the testing of the digital system of FIG. 4. FIG. 5a illustrates the operation required in each scan chain, chain 0 (140), chain 1 (130) and chain 2 (150). For the three flip-flops of FIGS. 3a, b, and c, this operation requires different signals. CK is the system clock rate and is applied to the clock input CK of FIG. 4. FIG. 5b graphically illustrates the signals required for the flip-flip of FIG. 3a. The scan chains are assumed to be homogenous (all the same type of flip-flip). SE0 is the scan enable signal applied to scan chain 150. Scan chain 150 operates at the system clock rate CK. A clock enable signal is not applied to scan chain 150. The scan chain 130 operates at a lower rate than the system clock CK and has applied to it clock enable signal ce1 and scan enable signal SE1. FIG. 5c shows the signals required for the flip-flops of FIG. 3b while FIG. 5d shows the signals for the flip-flop of FIG. 3c.

FIGS. 5b, c, and d only show one of the variations corresponding to each FF type. There always exists more than one solution because there is always a situation where either ce or se can assume any value (see FIG. 3). Also, the various ce and se pulses could be only half a clock period wide if they are derived from the clock ck.

FIGS. 5b, c and d show the best trade-off for a given FF type. For example, ce1 and ce2 in FIG. 5b could be identical to ce1 and ce2 or FIG. 5c and FIG. 5d. However, it seems better to minimize the number of transitions on those signals to minimize the power consumption. In order to minimize the number of different signals generated by the BIST controller 100, ce1 and ce2 could always be generated the same way and 2 flavors of se1 and se2 are needed. They are the ones shown in FIG. 5b and FIG. 5d.

Figure 6A:
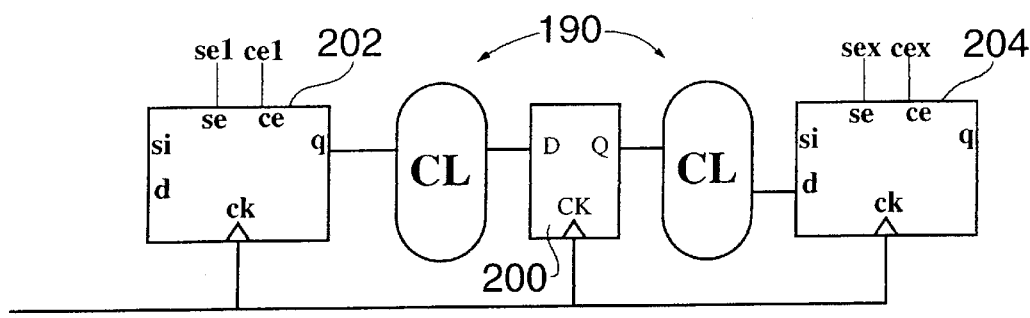
FIGS. 6a and b illustrate in block diagrams second and third embodiments of the present invention.
Figure 6B:
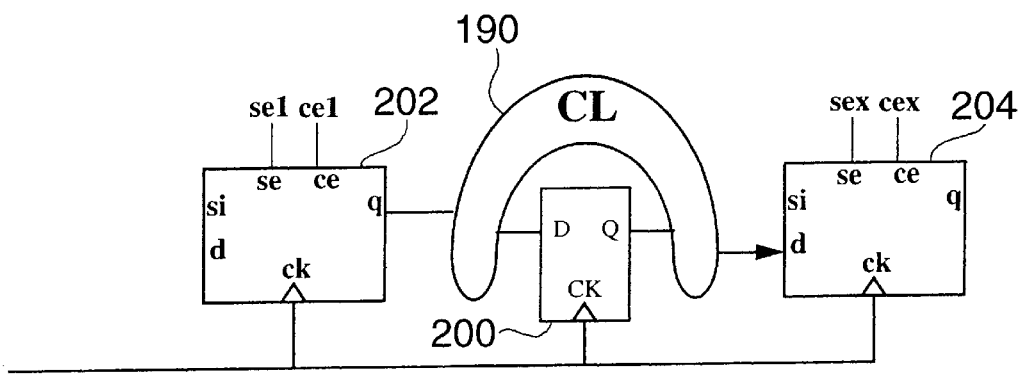

Referring to FIGS. 6a and b, there are illustrated in block diagrams second and third embodiments of the present invention. In FIGS. 6a and 6b, the logic network 190 includes an unscanable flip flop 200. The presence of flip flop 200 in the logic network 190 necessitates two clock cycles for the data to pass through the network. Consequently, the scannable element 202 on one side of the network is operated at one-half the system clock rate CK. The clock enable signal CE1 and scan enable signal SE1 are as shown in FIG. 5. The other scannable element 204 is operated at some other multiple of ck and cex.

FIG. 6a illustrates Isolated combinational logic blocks. The combinational logic blocks are fully testable.

FIG. 6b illustrates a logic circuit in which some gates of the combinational logic blocks depend on the state of the scannable registers and non-scannable registers. Some faults in the combinational block might be untestable.

Referring to FIG. 7a there is illustrated in a block diagram a fourth memory element configuration. The memory element 210 includes a flip flop 212, first multiplexer 214 and second multiplexer 216 providing inputs 218, 220, 222, 224, 226 and 228 for data, scan enable, scan data, clock enable, clock and scan bypass input respectively. FIG. 7b shows a symbol for the memory element 210. The memory element 210 allows for multi-cycle designs based on a flip flop design having a feedback mux to provide hold mode of operation.

Referring to FIG. 7c, there is illustrated a simplified example circuit using the memory element of FIG. 7a. The circuit includes a single scan chain 230 made up of three different types of memory elements. They are memory element 10 from FIG. 1, memory element 60 from FIG. 3d and memory element 210 from FIG. 7a.

Most designs are created in a hierarchical fashion. The FFs and combinational gates are included in modules to simplify the design task. It is often desirable to avoid the creation of multiple scan chains in those modules containing a mix of FFs working at different frequencies due to localized multi-cycle paths. FIG. 7c indicates how this can be done.

Figure 8:
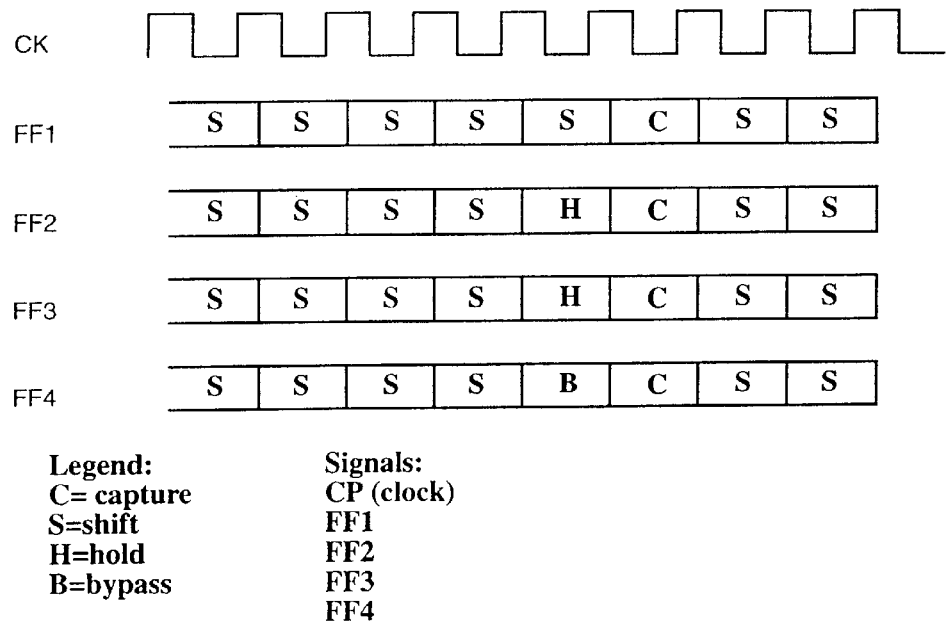
FIG. 8 graphically illustrates a timing diagram for the embodiment of FIG. 7c.

A small circuit composed of four FFs and a combinational network is shown. The actual function of the combinational network is not important. The only relevant feature is the presence of multi-cycle paths identified by thick lines 240 through the network. Assume that it takes two clock cycles for signals to propagate from the output of FF2 and FF3 to the input of FF1. FF2 and FF3 must then be able to hold their output stable for at least 2 clock cycles prior to the capture of the data input of FF1 as shown in the timing diagram (FIG. 8). Most of the shifting operations can be performed at the highest speed imposed by ck and the scan data is shifted from FF1 to FF4 in that order. However, since FF2 and FF3 stop shifting 2 cycles before the capture cycle, the last bit of data to be shifted in FF4 must be provided by FF1, bypassing FF2 and FF3.

The exact control signals se0 and se1 depends on the style of FFs used. For this example, we assumed that FF2 and FF3 are implemented as shown in FIG. 3c (priority data). The se1 and se1 signals are then identical to the ones used in FIG. 5c.

More than two frequencies can be mixed on a same scan chain and rules have been established to determine how the bypass mechanism works in each case.

Figure 9:
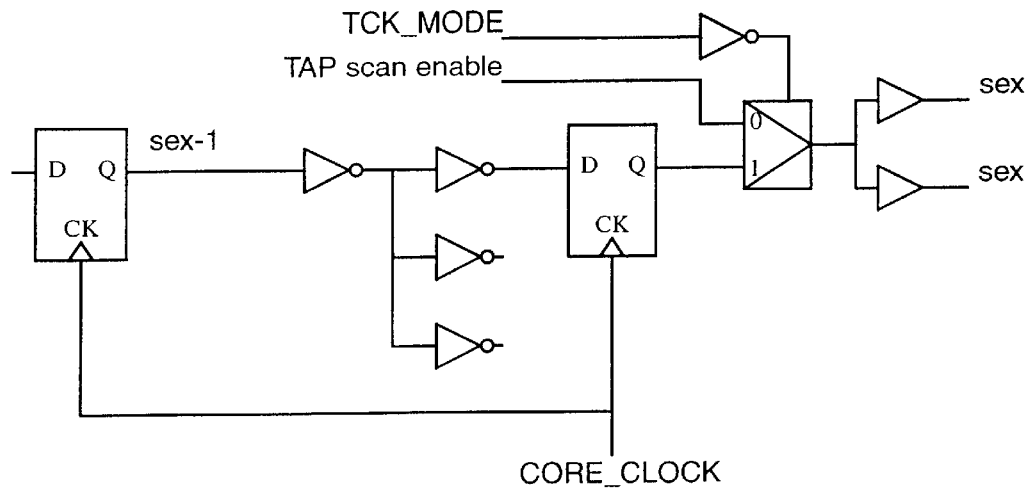
FIG. 9 schematically illustrates pipelining of scan enable and clock enable for use in the systems of FIGS. 4, 6 and 8.

Referring to FIG. 9, there is schematically illustrated pipeline for the scan enable for circuit designs having the IEEE tap signal available.

Large high speed designs may have difficulty in distributing the scan enable signals and clock enable signals in one clock period. These signals must then be pipelined ie generated a certain number of clock cycles in advance and propagated through buffer trees and registers to meet design requirements. This technique is relatively well known. However, special considerations must be given to scan enable signals in the case the design includes an IEEE 1149.1 Test Access Port (TAP). The scan enable signal generated by the TAP must bypass the pipeline stages as shown in FIG. 9. This is acceptable since the tests performed using the TAP generated signals are performed at lower speed than the normal mode of operation of the circuit.

Numerous other modifications, variations and adaptions may be made to the particular embodiments of the invention described above without departing from the scope of the invention as defined in the claims.

What is claimed is:

1. A method for use in testing digital systems having a plurality of scannable memory elements and a logic network, each said memory element having a clock input for receiving a common clock signal and being operable in normal mode at a system clock rate, an output and a data input, each said memory element being configurable in a SCAN mode in which said data input of each said element is connected to the output of another of said elements so as to define a scan chain for serially shifting data into and out of said elements, in a HOLD mode for holding data therein during one or more clock cycles of said clock signal, and in a CAPTURE mode in which said input is connected to said logic network, said logic network defining at least one signal path there through for each said elements, said paths extending from the output of said memory elements to the data input of another memory element, at least one of said elements having a signal path duration which is greater than one period of said system clock rate, said method comprising:

configuring said elements in SCAN mode:

shifting a test stimulus pattern into said scan chain and into said elements thereof while clocking said memory elements at a test clock rate until the test stimulus pattern is shifted into all said scannable memory elements;

during said shifting, configuring in said HOLD mode, for a predetermined number of clock cycles prior to a CAPTURE operation, each element having a signal path whose duration is greater than one clock cycle, said predetermined number of clock cycles being equal to or greater than the number of cycles required for a signal output from said each element to propagate to the input of said another memory element;

configuring said scannable memory elements in a CAPTURE mode to capture the signal at the inputs of said elements, said signal being representative of the response of said logic network to said test stimulus pattern;

configuring said elements in SCAN mode; and shifting out the data from said elements.

2. A method of testing a digital system as defined in claim 1, said configuring in HOLD mode including concurrently bypassing said elements configured in HOLD mode.

3. A method of testing a digital system as defined in claim 1, said predetermined number of clock cycles being a predetermined number of system clock cycles.

4. A method of testing a digital system as defined in claim 1, further including applying a test stimulus pattern to the inputs of the logic network not connected to the output of a scannable memory element prior to said step of configuring said scannable memory elements in a CAPTURE mode.

5. A method of testing a digital system as defined in claim 1, said configuring said elements in a SCAN mode including decoupling said input from said network.

6. A method of testing digital system as defined in claim 1, said step of shifting out being performed concurrently with said step of shifting a test stimulus pattern.

7. A method of testing a digital system as defined in claim 1, further including repeating said method as many times as required.

8. A method for use in testing digital systems having a plurality of scannable memory elements and a logic network, each said memory element having a clock input for receiving a common clock signal and being operable in normal mode at a system clock rate, an output and a data input, each said memory element being configurable in a SCAN mode in which said data input of each said element is connected to the output of another of said elements so as to define a scan chain for serially shifting data into and out of said elements, in HOLD mode for holding data therein during one or more clock cycle of said clock signal, and in a CAPTURE mode in which said input is connected to sad logic network, said logic network defining at least one signal path therethrough for each of said elements said paths extending from the output of said memory elements to the data input of another memory element, at least one of said elements having a signal path duration which is greater than one period of said system clock rate, said method comprising:

configuring said elements in SCAN mode;

shifting a test stimulus pattern into said scan chain and into said elements thereof while clocking said memory elements at a test clock rate until the test stimulus pattern is shifted into all said scannable memory elements;

during said shifting, configuring in said HOLD mode for a predetermined number of clock cycles prior to a CAPTURE operation, each element having a signal path whose duration is greater than one clock cycle, said predetermined number of clock cycles being equal to or grater than the number of cycles required for a signal output from said each element to propagate to the input of said another memory element and concurrently bypassing said each said elements configured in HOLD mode;

applying a test stimulus pattern to the inputs of the logic network not connected to the output of a scannable memory element;

decoupling said input of each said element from said network and concurrently configuring said scannable memory elements in a CAPTURE mode to capture the signal at the inputs of said elements, said signal being representative of the response of said logic network to said test stimulus pattern;

configuring said elements in SCAN mode; and shifting out the data from said elements concurrently with said step of shifting a test stimulus pattern into said scan chain.

9. A method of testing a digital system as defined in claim 8, further including repeating said method as many times as required.

10. A method for use in testing digital systems having a plurality of scannable memory elements and a logic network, each said memory element having a clock input for receiving a common clock signal and being operable in normal mode at a system clock rate, each said memory element having an output and a data input, and being configurable in a SCAN mode in which said data input of each said element is connected to the output of another of said elements; in a HOLD mode for holding data therein during one or more clock cycles of said clock signal, and in a CAPTURE mode in which said input is connected to said logic network, said elements being arranged in at least one scan chain, said method comprising:

shifting a test stimulus pattern into each said scan chain and into each said element therein while clocking said memory elements at a test clock rate until the test stimulus pattern is shifted into all scannable memory elements;

during said shifting step, configuring each said element in each said scan chain in said HOLD mode for a predetermined number of clock cycles between SHIFT cycles or between a SHIFT cycle and a CAPTURE cycle;

configuring said scannable memory elements in all scan chains in a CAPTURE mode to capture the signal at the inputs of said elements, said signal being representative of the response of said logic network to said test stimulus pattern;

configuring said elements in SCAN mode; and shifting our the data from said elements.

11. A method of testing a digital system as defined in claim 10, said predetermined number of cycles of said scan chains being selected such that all memory elements in all scan chains perform a CAPTURE operation simultaneously.

12. A method of testing a digital system as defined in claim 10, said step of shifting out being performed concurrently with said shifting a test stimulus pattern.

13. A method of testing a digital system as defined in claim 10, said step of shifting out including configuring each said element in each said scan chain in said HOLD mode for said predetermined number of clock cycles between SHIFT cycles.

14. A method of testing a digital system as defined in claim 10, further including repeating said method as many times as required.

15. A method of testing a digital system as defined in claim 10, said predetermined number of clock cycles being a predetermined number of system clock cycles.

16. A method of testing a digital system as defined in claim 10, further including applying a test stimulus pattern to the inputs of the logic network not connected to the output of a scannable memory element prior to said configuring said scannable memory elements in a CAPTURE.

17. A method for use in testing digital systems having a plurality of scannable memory elements and a logic network, each said memory element having a clock input for receiving a common clock signal and being operable in normal mode at a system clock rate, each said memory element having an output and a data input, and being configurable in a SCAN mode in which said data input of each said element is connected to the output of another of said elements so as to define a scan chain for serially shifting data into and out of said elements; in a HOLD mode for holding data therein during one or more clock cycles of said clock signal, and in a CAPTURE mode in which said input is connected to said logic network, said elements being arranged in at least one scan chain, said method comprising:

configuring said elements in all scan chains in SCAN mode;

shifting a test stimulus pattern into each said scan chain and into each said element therein while clocking said memory elements at a test clock rate until the test stimulus pattern is shifted into all scannable memory elements;

during said shifting, configuring each said element in each said scan chain in said HOLD mode for a predetermined number of clock cycles between SHIFT cycles or between a SHIFT cycle and a CAPTURE cycle, said predetermined number of cycles being selected such that all memory elements in all scan chains perform a Capture operation simultaneously;

configuring said scannable memory elements in all scan chains in a CAPTURE mode to capture the signal at the inputs of said elements, said signal being representative of the response of said logic network to said test stimulus pattern;

configuring said elements in SCAN mode; and shifting out the data from said elements concurrently with said shifting a test stimulus pattern into each said scan chain, said shifting out including configuring each said element in each said scan chain in said HOLD mode for said predetermined number of clock cycles between SHIFT cycles.

18. A method of testing a digital system as defined in claim 17, further including repeating said method as many times as required.

19. A digital system, comprising:

a logic network;

a plurality of scannable memory elements connected to said network, each said element having a clock input connected to a common clock source signal and being operable in normal mode at a system clock rate, an output and a data input, and being configurable:

In a SCAN mode in which said data input of each said element is connected to the output of another of said elements so as to define at least one scan chain for serially shifting data into and out of said elements;

in a HOLD mode for holding data therein during one or more clock cycles of a test clock; and in a CAPTURE mode in which said input is connected to said network, said logic circuit defining at least one signal path therethrough for each said element, said paths extending from the output of said memory elements to the data input of another memory element;

means for selectively configuring the memory elements in said modes;

means for clocking a test stimulus pattern into said scan chain while clocking said elements at a test clock rate, said means for selectively configuring being operable to configure said element in each said scan chain in said HOLD mode for a predetermined number of clock cycles between SHIFT cycles or between a shift cycle and a capture cycle;

means for configuring said scannable memory elements in all scan chains in a CAPTURE mode to capture the signal at the inputs of said elements;

means for shifting out the data from said elements; and means for analyzing said data.

20. A digital system as defined in claim 19, said means for configuring said memory elements further including means for generating clock enable and scan enable signals for configuring said memory elements in one of said modes, said memory elements being responsive to said clock enable and scan enable signals by adopting a mode corresponding to said signals.

21. A digital system as defined in claim 19, further including a multiple input signature register for analyzing test response data.

22. A digital system as defined in claim 19, further including a pseudo random pattern generator for generating said test stimulus pattern.

23. A digital system comprising:

a logic network;

a plurality of scannable memory elements connected to said network, each said element having a clock input connected to a common clock source signal and being operable in normal mode at a system clock rate, each said element having an output and a data input, and being configurable;

in a SCAN mode in which said data input of each said element is connected to the output of another of said elements so as to define at least one scan chain for serially shifting data into and out of said elements;

in a HOLD mode for holding data therein during one or more clock cycles of a test clock; and means for selectively configuring said memory elements in said modes;

means for clocking a test stimulus pattern into said scan chain while clocking said elements at a test clock rate, said means for selectively configuring being operable to configure said element in each said scan chain in said HOLD mode for a predetermined number of clock cycles prior to a CAPTURE operation, each element having a signal path whose duration is greater than one clock cycle, said predetermined number of clock cycles being equal to or greater than the number of cycles required for a signal output from said each element to propagate to the input of said another memory element;

means for configuring said scannable memory elements in all scan chains in a CAPTURE mode to capture the signal at the inputs of said elements;

means for shifting out the data from said elements; and means for analyzing said data.

24. A digital system as defined in claim 23, further including means for bypassing said each element configured in said HOLD mode.

25. A digital system as defined in claim 24, said means for bypassing including means connecting the output of said another memory element to the input of a memory element downstream in the scan chain containing said element configured in said HOLD mode.

26. A digital system as defined in claim 23, said means for configuring said memory elements further including means for generating clock enable and scan enable signals for configuring said memory elements in one of said modes, said memory elements being responsive to said clock enable and scan enable signals by adopting a mode corresponding to said signals.

27. A digital system as defined in claim 23, further including a multiple input signature register for analyzing test response data.

28. A digital system as defined in claim 23, further including a pseudo random pattern generator for generating said test stimulus pattern.

* * * * *